United States Patent
Jourdan et al.

(10) Patent No.: US 11,243,272 B2
(45) Date of Patent: Feb. 8, 2022

(54) MAGNETIC FIELD GRADIENT SENSOR WITH REDUCED SENSITIVITY TO VIBRATIONS

(71) Applicant: COMMISSARIAT A L'ENERGIE ATOMIQUE ET AUX ENERGIES ALTERNATIVES, Paris (FR)

(72) Inventors: Guillaume Jourdan, Grenoble (FR); Bertrand Delaet, Bernin (FR); Loic Joet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/761,590

(22) PCT Filed: Nov. 6, 2018

(86) PCT No.: PCT/FR2018/052726
§ 371 (c)(1),
(2) Date: May 5, 2020

(87) PCT Pub. No.: WO2019/092348
PCT Pub. Date: May 16, 2019

(65) Prior Publication Data
US 2020/0271733 A1    Aug. 27, 2020

(30) Foreign Application Priority Data
Nov. 8, 2017 (FR) ...................... 17 60494

(51) Int. Cl.
*G01R 33/00* (2006.01)
*G01R 33/022* (2006.01)
*G01R 33/028* (2006.01)

(52) U.S. Cl.
CPC ....... *G01R 33/022* (2013.01); *G01R 33/0286* (2013.01)

(58) Field of Classification Search
CPC ................ G01R 33/00; G01R 33/0035; G01R 33/0023; G01R 33/0017; G01R 31/3191;
(Continued)

(56) References Cited

U.S. PATENT DOCUMENTS

2002/0070723 A1    6/2002    Herbert et al.
2005/0040808 A1    2/2005    Herbert et al.
(Continued)

FOREIGN PATENT DOCUMENTS

EP          1 306 350 A2       5/2003
WO     WO 2015/058229 A1    4/2015

OTHER PUBLICATIONS

U.S. Appl. No. 15/248,756, filed Aug. 26, 2016, 2017/0059420 A1, Patrice Rey, et al.
(Continued)

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A magnetic field gradient sensor includes a support and a structure having at least a first and a second mobile element, at least one magnetic sensor, each magnetic sensor being mechanically secured to one of the first and/or second mobile elements so as to be able to apply a mechanical force to the structure in the presence of a magnetic field gradient, a coupler for coupling between the first and second mobile elements so that the structure can be moved in at least one balanced mechanical mode in the presence of a magnetic field gradient, and a sensor for measuring the movement of the structure at least in balanced mode.

22 Claims, 6 Drawing Sheets

(58) Field of Classification Search
CPC .. G01R 33/022; G01R 33/0286; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 2006/0181273 A1* | 8/2006 | Greywall | G01R 33/0283 324/256 |
| 2007/0096729 A1* | 5/2007 | Brunson | G01R 33/0286 324/244 |
| 2011/0151589 A1 | 6/2011 | Redon | |
| 2012/0176129 A1* | 7/2012 | Seeger | G01R 33/0286 324/252 |

OTHER PUBLICATIONS

U.S. Appl. No. 15/297,243, filed Oct. 19, 2016, 2017/0117825 A1, Guillaume Jourdan, et al.
U.S. Appl. No. 15/625,314, filed Jun. 16, 2017, 2017/0363424 A1, Federico Maspero, et al.
U.S. Appl. No. 15/850,453, filed Dec. 21, 2017, 2018/0183404 A1, Guillaume Jourdan, et al.
U.S. Appl. No. 15/768,870, filed Apr. 17, 2018, 2018/0327253 A1, Guillaume Jourdan, et al.
U.S. Appl. No. 16/471,378, filed Jun. 19, 2019, 2019/0330050 A1, Guillaume Jourdan, et al.
U.S. Appl. No. 16/348,004, filed Nov. 9, 2017, Loic Joet, et al.
U.S. Appl. No. 16/466,432, filed Jun. 4, 2019, 2019/0308873 A1, Loic Joet.
U.S. Appl. No. 16/590,015, filed Oct. 1, 2019, 2020/0102211 A1, Loic Joet, et al.
U.S. Appl. No. 16/716,632, filed Dec. 17, 2019, Samer Dagher, et al.
U.S. Appl. No. 16/721,578, filed Dec. 19, 2019, Samer Dagher, et al.
U.S. Appl. No. 16/717,866, filed Dec. 17, 2019, Thierry Hilt, et al.
International Search Report dated Feb. 20, 2019 in PCT/FR2018/052726 filed on Nov. 6, 2018, 3 pages.
French Preliminary Search Report dated Jun. 25, 2018 in French Application 1760494 filed on Nov. 8, 2017.

* cited by examiner

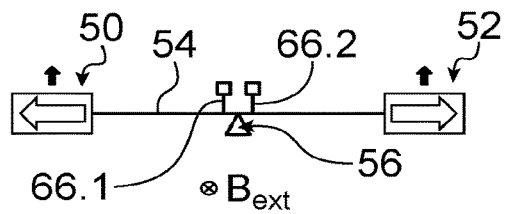
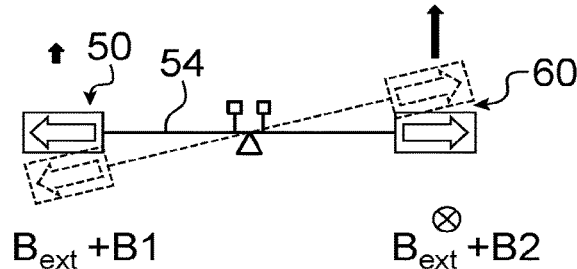
FIG.8A　　　　FIG.8B
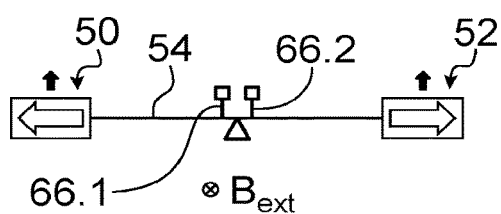
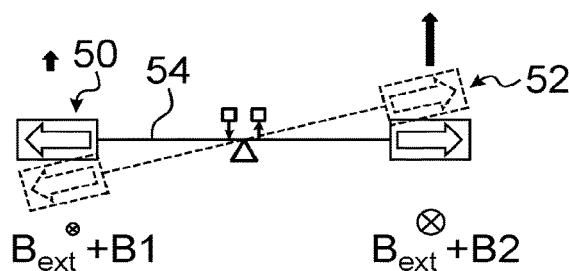
FIG.9A　　　　FIG.9B
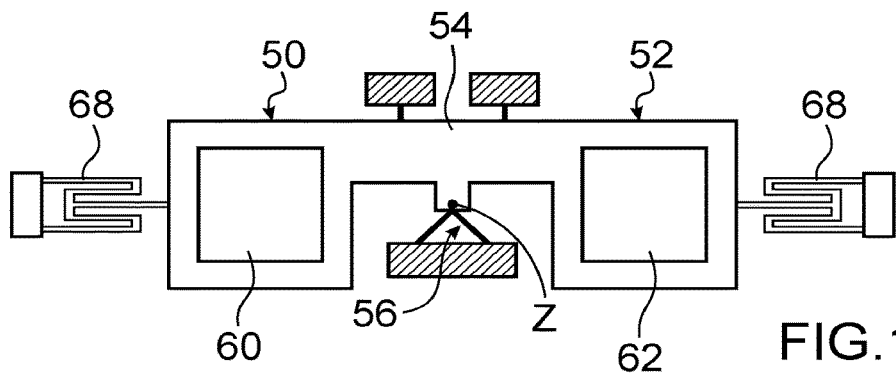
FIG.10
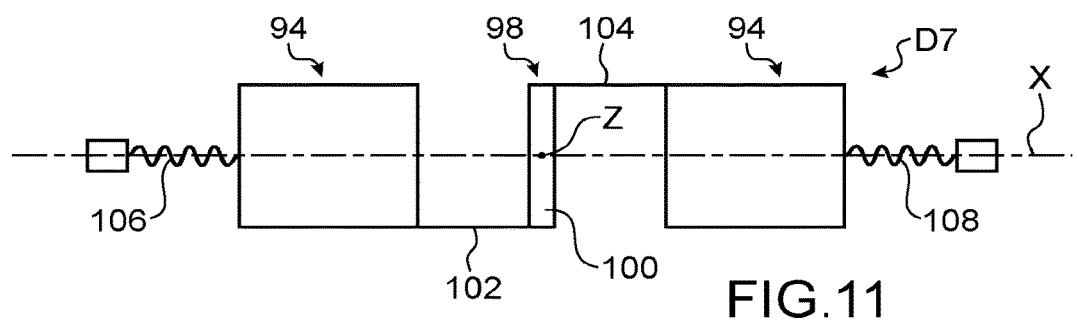
FIG.11

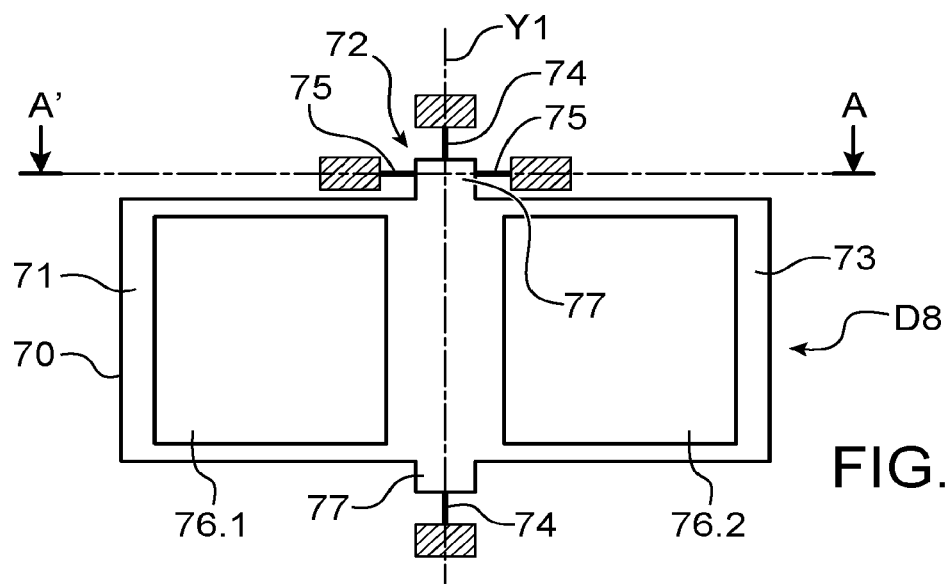
FIG.12A
FIG.12B
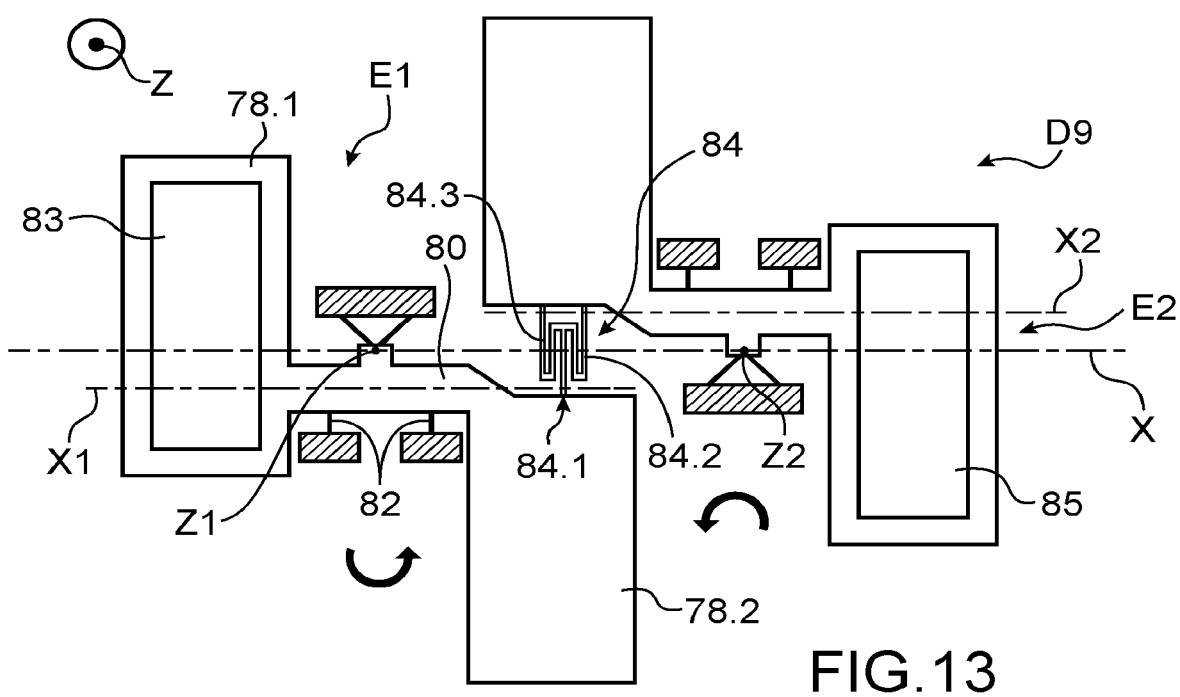
FIG.13

MAGNETIC FIELD GRADIENT SENSOR WITH REDUCED SENSITIVITY TO VIBRATIONS

TECHNICAL FIELD AND STATE OF PRIOR ART

The present invention relates to a magnetic field gradient sensor offering reduced sensitivity to vibrations.

Magnetic field gradient sensors can for example be used in detecting the angular position of a camshaft or a crankshaft in combustion engines.

For example, a device for detecting the angular position of a camshaft or a crankshaft includes a so-called "target" wheel, connected to the shaft and provided with teeth and throats, and a position sensor disposed in front of the wheel.

The position sensor includes a permanent magnet and one or more magnetometers. The teeth and throats of the wheel concentrate the field lines of the permanent magnet or not, which results in varying the magnetic field at the magnetometer(s).

The detection device is subjected to the following requirements:
the device has to be capable of detecting small magnetic field variations, whereas the permanent or common magnetic field induced by the permanent magnet is very high,
it undergoes vibrations but they should not or only slightly affect measurements, and
it is subjected to strong stray external magnetic fields (or magnetic noise) which should not or only slightly disturb the measurement.

In order to make a magnetic field gradient sensor, two magnetometers disposed at a given distance from each other are associated. By subtracting both signals, the magnetic field gradient value is obtained along one direction.

This technique enables the passage from a throat to a tooth to be detected, or vice versa: one of both magnetometers then receiving a stronger signal than the other. It also enables the static field to be dispensed with, because it disappears upon subtracting both signals. The effect of the stray fields which are nearly the same at both magnetometers is also cancelled upon subtracting. This reading of the spatial derivative, or gradient, of the magnetic field thus enables small field variations to be detected and external magnetic field to be dispensed with.

In order to make the device robust to vibrations, sensors without moving part are used, such as magnetoresistive sensors including one or more magnetic layers the resistance of which varies as a function of the ambient magnetic field, or Hall effect sensors.

However, even if upon subtracting, the common magnetic field is cancelled, it is necessarily measured by both magnetometers. Each magnetometer has to be capable of measuring the strong static magnetic field while keeping sufficient precision to measure small variations desired to be measured.

Additionally, regarding the cancellation of common field and magnetic noise by subtracting the signals from both magnetometers, it is only achieved if the magnetometers and their reading chain are completely identical. This means that a difference in gain or signal phase, orientation of the magnetometers or any other dissymmetry between both magnetometers does not allow complete cancellation of magnetic noise and common field.

Document US2007/0096729 describes a device capable of both measuring a magnetic field and a magnetic field gradient. It includes an only translationally movable suspended structure. It includes two legs at a distance from each other through which currents flowing in opposite senses travel. When a magnetic gradient exists, both legs are subjected to Lorentz forces which are exerted in opposite senses. The translation of the structure results from the resultant Lorentz forces. It is then possible to deduce the magnetic field gradient.

Since this structure is translationally movable, it is very sensitive to vibrations.

DISCLOSURE OF THE INVENTION

Consequently, a purpose of the present invention is to offer a magnetic field gradient sensor capable of measuring a magnetic field difference along a direction between two points in space, only slightly or not sensitive to vibrations and offering a sufficient sensitivity to measure small magnetic field differences.

The above set forth purpose is achieved by a magnetic field gradient sensor including a mechanical structure actuatable according to at least one balanced mechanical mode, means for transducing magnetic fields detected at two points of the structure into a mechanical resultant of the difference between these magnetic fields and means for transducing the mechanical resultant into an electrical resultant.

By means of the invention, by implementing a mechanical structure that can be actuated according to at least one balanced mode, the different input signals, i.e. the field gradient, mean magnetic field, vibrations to be separated, upstream of the mechanical-electrical transduction means.

Indeed, the magnetic field gradient components generate balanced mode movements, whereas the mean or common magnetic field can possibly move the unbalanced mode(s). As regards inertial forces from vibrations of the surrounding medium, they only mainly generate unbalanced mode movements.

Thus, by making a device which includes at least one balanced mode which further has an electromechanical transduction gain and/or a magnetic-mechanical transduction gain which are higher for movements in the balanced mode, the device delivers a signal proportional to the magnetic field gradient which is only slightly disturbed by stray signals, such as vibrations and mean magnetic field.

For example, a structure having equivalent electromechanical transduction gains for balanced and unbalanced modes is such that it has a higher mechanical-magnetic sensitivity in the balanced mode than in the unbalanced mode.

In another example, the structure has an electromechanical transduction gain for movements in the balanced mode that is much higher than that of movements in the unbalanced mode, this is for example achieved with a structure including two masses able to be displaced in the same direction and in opposite senses, and including electromechanical transduction means measuring the displacement of each of the masses.

The input dynamics of the reading electronics of the device according to the invention is then largely reduced, because the effect of the mean magnetic field is cancelled or at least substantially decreased. It is then possible to use simpler electronics and/or to increase the sensor performance. The same is true for the variation range of mechanical displacement or mechanical load in the structure, which enables requirements on the strength of the mechanical detection device to be decreased, while keeping a proper measurement resolution level.

Further, since the difference in the signals of interest is made mechanically, thus very soon in the measurement chain, it is possible to pool a large number of components of the conditioning chain. Further, parts of the measurement chain which are not common include few components, it is then easier to make two parts offering close properties in terms of transduction gain, . . . .

Magnetic-mechanical transduction means can include one or more permanent magnetic materials, or electric conductors through which electric currents pass to generate Laplace forces. The implementation of electric conductors advantageously enables either the magnetic field gradient or the permanent magnetic field to be measured by reversing the current flowing sense in one of both conductors. The electromechanical transduction means can be of the capacitive, piezoresistive, piezoelectric or resonant type.

Then, one subject-matter of the present invention is a magnetic field gradient sensor including a support and a structure including at least one first and one second movable element, at least one magnetic sensor mechanically secured to one of the first and second movable elements, so as to be able to apply a mechanical load to the structure in the presence of a magnetic field gradient, coupling means between the first movable element and the second movable element, such that the structure can be displaced according to at least one balanced mechanical mode in the presence of a magnetic field gradient, and structure displacement measurement means at least for the balanced mode.

For example, the magnetic field gradient sensor includes at least two magnetic sensors, each of the magnetic sensors being mechanically secured to one of the first and second movable elements, so as to be able to apply a mechanical load to the structure in the presence of a magnetic field gradient, coupling means between the first movable element and the second movable element, such that the structure can be displaced according to at least one balanced mechanical mode in the presence of a magnetic field gradient, and structure displacement measurement means at least for the balanced mode.

According to one exemplary embodiment, the mechanical coupling means can be such that they allow translational displacement of the first movable element and the second movable element with respect to each other along a first given direction at least in opposite senses, corresponding to the balanced mechanical mode.

Preferably, the first movable element and the second movable element are translationally displaced in the same plane. Still more preferably, the centres of inertia of the first and second movable elements have movements or trajectories which are carried out along a same straight line, in opposite senses. The mechanical mode thus has a zero kinetic moment and is only slightly sensitive to a rotational external vibration.

The mechanical coupling means can also be secured to two other elements translationally movable along a direction orthogonal to the first direction and prohibiting displacement in phase of the first and second movable elements, corresponding to an unbalanced mechanical mode. The mechanical coupling means can be a spring, for example a rhombus-shaped spring, the first and second movable elements being each connected to an apex of the rhombus, the apexes being opposite to each other.

According to another example, the mechanical coupling means form a pivot hinge of the structure to the support. The mechanical coupling means can rigidly connect the first movable element and the second movable element.

The structure displacement measurement means in the balanced mode can be capacitive means. The structure displacement measurement means in balanced mode can include at least two capacitive combs, one comb (being secured to a movable element and one comb is secured to the support and the even combs can be electrically connected in parallel. Alternatively, the structure displacement measurement means in balanced mode can include at least one strain gauge suspended between the support and the coupling means.

According to another example, the magnetic field gradient sensor includes two assemblies, each assembly including the first or the second movable element, the mechanical coupling means connecting both assemblies. Each assembly can have a balanced mode.

Each assembly can be rotatably hinged to the support about an axis of rotation, both axes of rotation of both assemblies being parallel to each other, the coupling means being such that they allow rotational movements of both assemblies in opposite senses and prohibit rotational movements of both assemblies in the same sense.

In one exemplary embodiment, each magnetic sensor includes at least one permanent magnetic material deposited on at least one movable element.

Both magnetic sensors can have magnetic moments with an opposite orientation. Both magnetic sensors can have magnetic moments with a same orientation.

According to an additional characteristic, each magnetic sensor includes at least one electric conductor for an electric current to pass therethrough. The magnetic field gradient sensor can include flexible electrically conducting elements connecting the movable elements to contact studs secured to the support. The at least one electric conductor can extend in a direction such that Laplace forces generated move the structure of the device.

Alternatively, the at least one electric conductor is oriented toward the axis of rotation of the pivot connection formed by the mechanical coupling means.

BRIEF DESCRIPTION OF THE DRAWINGS

The present invention will be better understood based on the following description and the appended drawings in which:

FIGS. 8A and 8B are schematic representations of the sensor of FIG. 7 illustrating its operation in the case of magnetic sensors formed by a permanent magnetic material, FIGS. 9A and 9B are schematic representations of the sensor of FIG. 7 illustrating its operation in the case of magnetic sensors formed by electric conductors, FIG. 10 is a schematically represented top view of an exemplary sensor according to a second embodiment, particularly adapted to the implementation of magnetic sensors formed by electric conductors, FIG. 11 is a schematically represented top view of an exemplary sensor according to another embodiment, FIG. 12A is a schematically represented top view of an exemplary sensor according to the second embodiment, the sensor structure being rotatably movable out-of-plane, FIG. 12B is a cross-section view of the sensor of FIG. 12A along a cross-sectional plane A-A', FIG. 13 is a schematically represented top view of another exemplary sensor according to the second embodiment, implementing two assemblies rotatably movable in-plane.

DETAILED DISCLOSURE OF PARTICULAR EMBODIMENTS

In the following description, the measurement device or magnetic field gradient sensor will be referred to as field gradient measurement device or field gradient sensor.

Figure 1:
FIG. 1 is a schematic representation of a signal processing chain of the sensor according to the invention.

In FIG. 1, a schematic representation of the measurement chain of the field gradient measurement device according to the invention can be seen.

The measurement chain includes magnetic-mechanical transduction means designated as TMM transforming the magnetic field gradient VB into a mechanical load proportional to the field gradient which generates a displacement x, mechanical-electrical transduction means designated as TME converting the displacement proportional to the magnetic field gradient into an electric signal representative of the magnetic field gradient, and electric signal conditioning means designated as CSE producing the measurement signal s delivered by the sensor.

In the case where the CSE means implement piezoresistive gauges, they can be connected as a Wheatstone bridge. The bridge is voltage or current biased, and the measurement signal s is a reading of the voltage output from the bridge.

In the case where the CSE means implement capacitive means, variable capacitors are biased. The reading electronics absorbs and counts charges displaced during capacitance variations.

In the case where the CSE means are resonant means implementing at least one gauge, the gauge is excited and is kept vibrating at its resonant frequency by a closed loop control, for example a Phase-Locked Loop (PLL). The resonant frequency varies as a function of the strain in the gauge and is measured.

The magnetic-mechanical transduction TMM means have a transduction gain or sensitivity to the balanced mode movements designated as $G_e$ and to the unbalanced mode movements designated as $G_{ne}$. The mechanical-electric transduction means or electromechanical transduction TME means have a transduction gain or sensitivity to balanced mode movements designated as $T_e$ and to unbalanced mode movements designated as $T_{ne}$.

Regarding the gain of the magnetic-mechanical transduction means, loads exerted on the balanced mode of the mechanical structure are only proportional to the magnetic field gradient. This can be written as $$F_{\partial b} \propto \partial_i B_j$$

As will be described later, the transduction means can implement electric conductors, in which a current flows to generate Laplace forces causing one or more parts of the device to be displaced, or a magnetic material.

This results in a mechanical movement of the balanced mode designated as $x_e$ characterised by a mechanical transduction sensitivity:

$$x_e = G_e F_{\partial B}$$

Unbalanced modes are in turn sensitive to vibrations and possibly to the mean magnetic field. The vibration amplitude of the unbalanced modes designated as $x_{ne}$ is expressed as:

$$x_{ne} = G_{ne}(F_{vib} + F_B)$$

Electromechanical transduction means such as capacitive combs, piezoresistive gauges, the sensitivities to both movements of which are characterised by $T_e$ and $T_{ne}$, then transform these movements into a single signal s:

$$s = T_e x_e + T_{ne} x_{ne}$$

that is $s = T_e G_e F_{\partial B} + T_{ne} G_{ne}(F_{vib} + F_B)$ The invention provides a device emitting an output signal such that it is only slightly disturbed by the stray signals such as the vibrations and the permanent magnetic field, by acting on the transduction gains $G_e$, $G_{ne}$, $T_e$, $T_{ne}$.

Figure 2:
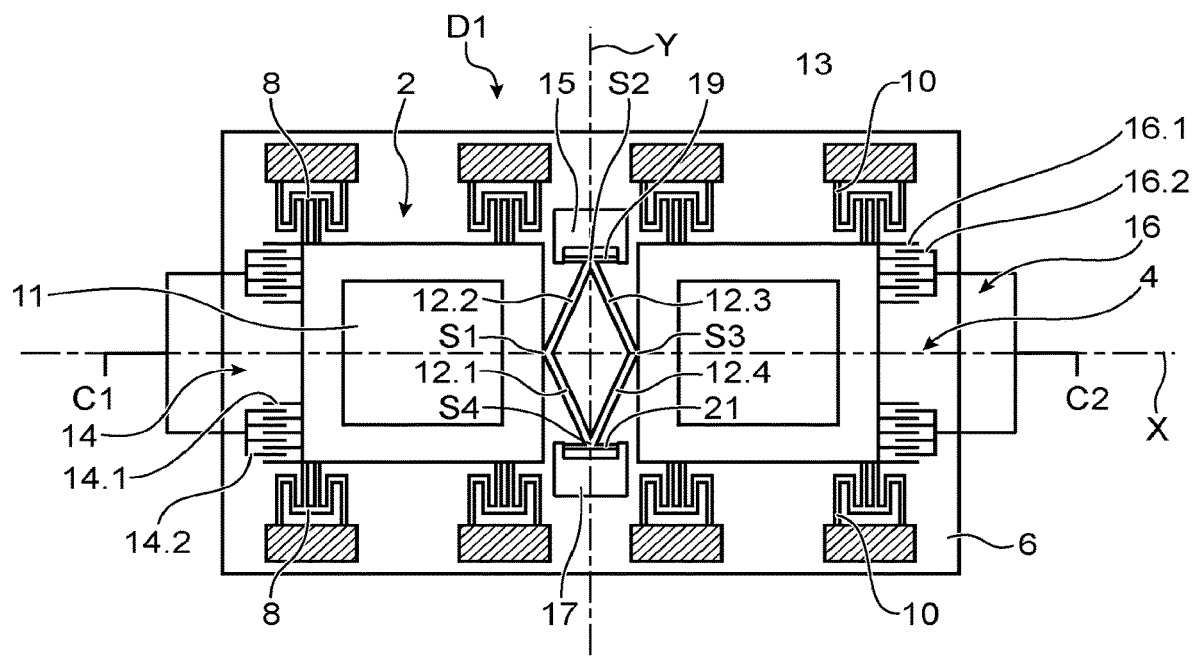
FIG. 2 is a schematically represented top view of an exemplary embodiment of a magnetic gradient sensor according to a first embodiment.

In FIG. 2, an exemplary embodiment of a field gradient measurement device according to a first embodiment can be seen.

According to the first embodiment, useful movements of the movable elements are translational movements in a given direction.

The device D1 includes a first mainly translationally movable element or mass 2 and a second mainly translationally movable element or mass 4 along the direction X.

Each movable element 2, 4 is suspended with respect to a support 6 in the plane of the device.

Advantageously, the first movable element 4 is suspended by four suspension means 8 disposed at the apexes of the movable elements enabling rotational degrees of freedom to be blocked. The suspension means are for example formed by flexible beams allowing displacement of the first movable element 2 along direction X and limiting displacements of the first movable element 2 in direction Y and in direction Z.

The second movable element 4 is also advantageously suspended by four suspension means 10 at apexes of the second movable element 4. The suspension means are formed by flexible beams allowing displacement of the second movable element 4 along direction X and limiting displacements of the first movable element 2 in direction Y and in direction Z.

The device also includes mechanical coupling means 12 for both movable elements 2, 4 so as to actuate the device according to at least one balanced mode. The coupling means 12 form a spring transmitting a load from one end of the spring to the other. The form of the coupling means can be any form.

In the example represented, the coupling means 12 include four beams 12.1, 12.2, 12.3, 12.4 forming a rhombus. A longitudinal end of the beams 12.1 and 12.2 is connected to a first movable element at an apex S1 and a longitudinal end of the beams 12.3 and 12.4 is connected to the second movable element at an apex S2. The other end of the beams 12.1 and 12.3 is connected to a anchoring stud 15 at an apex S3 and the other end of the beams 12.2 and 12.4 is connected to a anchoring stud 17 opposite to the stud 15 with respect to axis X, at an apex S4. The stiffness is in particular controlled by the beam width, the Young modulus of the material used, but also the angle of the beams with respect to each other.

In the example represented, the connection between the beams 12.1 and 12.3 at the stud 15 is made through a beam 19 secured to the stud 15 and the connection between the beams 12.2 and 12.4 to the stud 17 is made through a beam 21 secured to the stud 17. The beams 19, 21 are flexurally deformable and enable the apexes S2 and S4 to be displaced along direction Y, but they are not displaced along direction X, to ensure that the centre of the rhombus does not move.

The rhombus mainly deforms in direction X, the apexes S1 and S2 being displaced with respect to each other along direction X.

According to another example, the coupling means include a spring structure comprised of U-shaped beams the main arms of which are perpendicular to direction X.

The coupling means 12 enable the structure to be actuated according to at least one balanced mechanical mode and one unbalanced mechanical mode.

A mechanical mode of a structure is said to be balanced when the centre of inertia of the structure is stationary upon moving the structure according to this mode. Reversely, a mechanical mode of a structure is said to be unbalanced when the centre of inertia of the structure is displaced with the structure which is moved according to this mode.

In the example represented, the balanced mode corresponds to a phase opposition displacement of the movable elements, i.e. the apexes S1 and S2 are symmetrically displaced with respect to each other relative to axis Y. The apexes S1 and S2 move away from or closer to each other. The unbalanced mode corresponds to an in-phase displacement of movable elements, the apexes S1 and S2 being simultaneously displaced in the same sense in direction X.

Advantageously in the example represented, the TMM means include two permanent magnetic material elements 11, 13, each magnetic material elements 11, 13 being movably secured to each movable element 2, 4 and able to move each of the movable elements 2, 4 under the effect of a magnetic field. The elements 11 and 13 are designated as "magnetic sensors". A magnetic material has a magnetic moment M, which is oriented so as to generate a mechanical force on the movable element in the displacement direction thereof, along axis X in the example represented, in the presence of a magnetic field gradient.

The area of the movable elements is sufficient to allow a deposition of the magnetic material, preferably it has a width in the order of several tens µm, for example at least 50 µm, or even 100 µm.

Further, the movable elements have a thickness in direction Z sufficient for the elements to be only slightly deformable enabling integrity of the magnetic material layer(s) to be kept. The thickness of the elements is preferably between a few hundreds nm to a few micrometers.

In this example and more generally for structures the mass of which is a dictated translational movement, a single sensor on one of the movable elements can be used, it produces a force which is directly proportional to the field gradient.

Each magnetic material generates a magnetic force which can be written as F=M·∇ B=∇(M·B) for constant magnetic moments.

The mechanical force F applied to a movable element is thus directly proportional to the field gradient.

Figure 3:
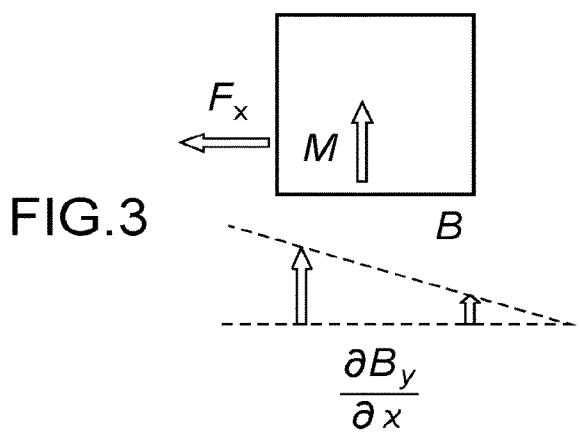
FIG. 3 is a schematic representation of the mechanical force generated by a field gradient in the presence of a magnetic material with a magnetic moment M.

In FIG. 3, a magnetic moment oriented along direction Y and the field gradient along Y along direction X is represented.

The force along axis X is written as:

$$F_x = M_y \frac{\partial B_y}{\partial x}$$

For a constant moment M oriented along axis X and a gradient along X along axis X, the force along axis X is written as:

$$F_x = M_x \frac{\partial B_x}{\partial x}$$

It is thus possible to access the different components of magnetic field gradient, by choosing the orientations of the moment M with respect to the axis on which a force is desired to be produced.

Permanent magnetic sensors are for example made in the form of layers deposited on at least one face of at least one movable element.

The magnetic sensor 11 has a magnetic moment M1 and the magnetic sensor 13 has a magnetic moment M2.

Preferably, the materials 11 and 13 have magnetic moments with equal modules. Advantageously, they are made of the same material and have the same volume.

Advantageously, the materials of the magnetic sensors are deposited onto the first and second movable elements such that their magnetic moments have opposite orientations.

Indeed, on a same structure, layers of magnetic materials having magnetic moments with different orientations, for example opposite orientations by means of the shape anisotropy phenomenon, as described in document US 2011/0151589. Alternatively, it is also contemplatable to orient differently the magnetic moment of magnetic materials for neighbouring zones by locally heating with a laser under a magnetic field oriented along the desired direction.

The mechanical-electrical transduction TME means include displacement detection means 14, 16 for the displacement along X of each first and second part.

In the example represented, the detection means 14, 16 are of the variable area capacitive type, each including one or more combs 14.1, 16.1 movably secured to the movable elements and combs 14.2, 16.2 secured to the support 6, the combs 14.1, 14.2 and 16.1, 16.2 being interdigitated. In the example represented, the detection means 14 include two pairs of interdigitated combs and the detection means 16 include two pairs of interdigitated combs. According to another example, the detection means 14, 16 may each include a single pair of interdigitated combs extending on the entire side of the movable elements 2, 4 along direction Y.

The means 14 have a capacitance C1 and the means 16 have a capacitance C2.

The detection means 14, 16 can be electrically connected so as to allow differential reading directly.

Alternatively, the detection means can include a comb secured to the first movable element 2 and a comb secured to the second movable element 4, both combs being interdigitated.

The operation of the device D1 will now be described.

A magnetic field gradient AB is applied to the structure and to both movable elements 2, 4 and to the magnetic sensors 11, 13 respectively.

Each magnetic sensor 11, 13 generates a force F1, F2 proportional to the field gradient.

$$F_1 = M1 \cdot \nabla B$$

$$F_2 = M2 \cdot \nabla B$$

The balanced mode is moved by the force $F_e$. The movable elements have a balanced mode displacement $x_e$. The unbalanced mode is moved by the force $F_{ne}$. The movable elements have an unbalanced mode displacement $x_{ne}$.

$$F_e = \frac{F_1 - F_2}{2} = \frac{M_1 \cdot \nabla B - M_2 \cdot \nabla B}{2}$$

$$F_{ne} = \frac{F_1 + F_2}{2} = \frac{M_1 \cdot \nabla B + M_2 \cdot \nabla B}{2}$$

Additionally, the structure is subjected to the mean magnetic field and possibly to external vibrations.

The structure is therefore simultaneously actuated in a balanced mechanical mode and in an unbalanced mechanical mode.

By definition, a balanced mode is not sensitive to vibrations. In this exemplary embodiment, the balanced mode is not sensitive to the mean magnetic field. Reversely, the unbalanced mode can be sensitive to vibrations along axis X and can be sensitive to the mean magnetic field but also to a field gradient force $F_{ne}$.

It is to be noted that the magnetic field exerts opposite mechanical torques with substantially identical modules on both movable elements.

Indeed, the mechanical torque applied to an element having volume dV carrying a material with a magnetic moment M is written as:

$$d\Gamma = M \vec{B} dV$$

But their mechanical action on the balanced mode related to the measurement chain is negligible. The rotation of the movable elements is blocked by the springs, which decreases the amplitude of disturbances produced by the mechanical torque on the balanced mode.

The displacement of the first and second movable elements is measured by the capacitive means.

According to the invention, the signal s output from the measurement chain is generated by the displacement $x_e$, and the measurement chain offers a reduced sensitivity to displacement $x_{ne}$.

In one exemplary embodiment, the capacitances C1 and C2 are read independently of each other. The signals are added, which also contributes to the removal of the residue of the displacement signal of the unbalanced mode the measurement are added, which also contributes to the removal of the residue from the displacement signal of the unbalanced mode.

In another exemplary embodiment, the capacitive detection means 14, 16 are connected in parallel so as to perform differential reading. The equivalent capacitance C is written as:

$$C = C1 + C2$$

This configuration of electrodes enables the sensitivity to the unbalanced mode movement $x_{ne}$ to be removed. Indeed, an in-phase movement (unbalanced mode) of both movable elements simultaneously produces opposite variations in the capacitances C1 and C2: thus, the capacitance C keeps its value. On the other hand, a phase opposition movement (balanced mode) produces a capacitance variation which can be read by an optimised reading electronics on the desired variation range for the magnetic field gradient sensor.

The TME transduction means of the device of FIG. 2 have a transduction gain $T_e$ in balanced mode which is much higher than that in unbalanced mode $T_{ne}$, therefore they are mainly sensitive to the balanced mode movements. This gain difference is achieved by means of the coupling means of both masses, which is rhombus-shaped in the example represented, which oppose a strong stiffness to any in-phase displacement and allow symmetric movements. Finally, capacitance variation reading is not sensitive to movements in the unbalanced mode due for example to mechanical vibrations, and only keep variations due to movements in the balanced mode due to the magnetic field gradient. Preferably, it is attempted to reach a ratio $T_{e/ne} < 5$.

In one advantageous example of the device of FIG. 2, both magnetic sensors have magnetic moments with opposite orientations: $M_1 = -M_2 = M$.

The first magnetic sensor 11 then applies a mechanical force $F_1 = M \cdot \nabla B$ on the movable element 2.

Since the magnetic moments of both magnetic sensors have opposite orientations, the second magnetic sensor 13 then applies a mechanical force $F_2 = -M19 \nabla B$ on the movable element 4

As a result, the forces $F_e$ and $F_{ne}$ respectively produced on the balanced and unbalanced modes have then as an expression:

$$F_e = \frac{F_1 - F_2}{2} = M \cdot \nabla B$$

$$F_{ne} = \frac{F_1 + F_2}{2} = 0$$

The force $F_e$ is directly proportional to the field gradient $\nabla B$.

Under these conditions, the $F_e$ value is advantageously maximised, the useful signal to generate the electric signal is also maximised.

Since $F_{ne}$ is zero, the unbalanced mode is essentially actuated by vibrations.

Preferably, both moments are of opposite signs.

In another example, the device of FIG. 2 includes two movable elements 2, 4 and a single magnetic sensor generating a single magnetic moment, on one of the movable elements 2, 4.

Figure 4:
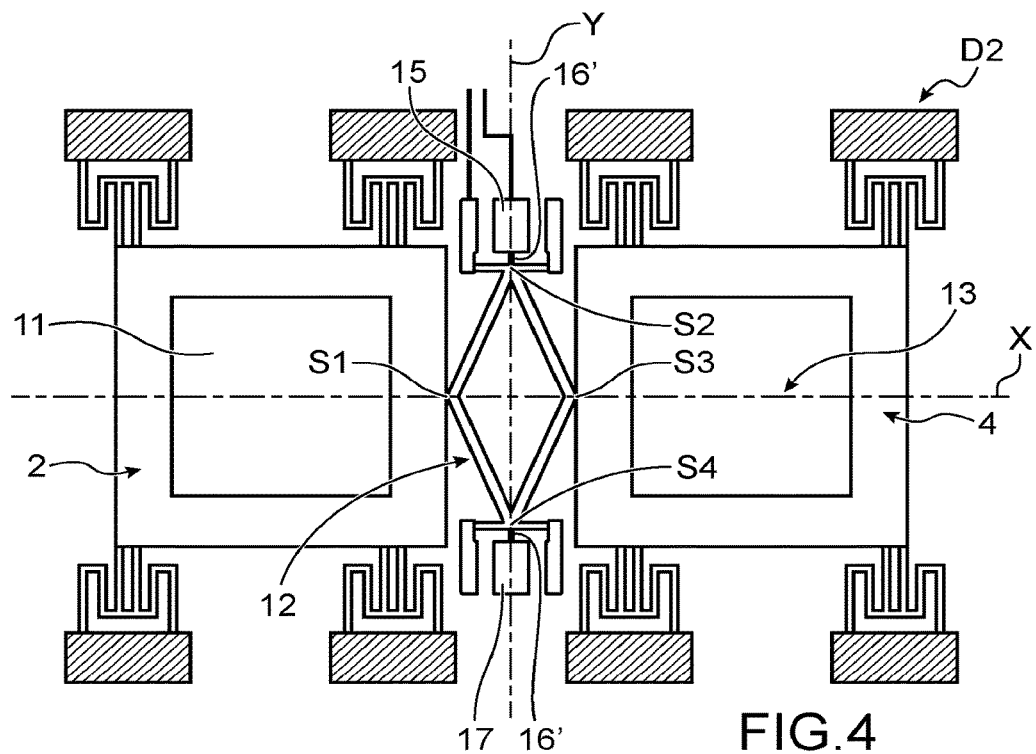
FIG. 4 is a schematically represented top view of an alternative of the sensor of FIG. 2 implementing piezoresistive gauges.

In FIG. 4, an alternative D2 of the device of FIG. 2 can be seen, wherein the TME means include strain gauges 16'. These gauges can be piezoelectric, piezoresistive or resonant.

In the example represented, a gauge 16' is suspended between the apex S3 of the rhombus and the anchoring stud 15 and a gauge 16' is suspended between the apex S4 and the anchoring stud 17.

Because of the symmetry of the structure relative to the axis aligned with both gauges, the gauges 16' undergo a first-order zero deformation when both movable elements oscillate in-phase.

When both movable elements oscillate in phase opposition, the gauges 16' are put in compression or extension. A reading electronics then enables electric resistance variations in the gauges which are proportional to the balanced mode movement $x_e$ to be measured. This configuration enables gauges to be protected from deformations produced by the unbalanced mode.

The transduction TME means of the device of FIG. 4 have a balanced mode transduction gain $T_e$ much higher than that in unbalanced mode $T_{ne}$, therefore they are mainly sensitive to balanced mode movements.

The coupling means 12 discard the unbalanced mode and transform the balanced mode into displacement along axis Y which is the axis of the gauges, whereas the effect of the unbalanced mode remains along axis X.

In another exemplary embodiment, it can be contemplated to mount the gauges as a differential, for example one of the gauges is disposed as in FIG. 4 outside the rhombus, and the other gauge is mounted inside the rhombus.

Further, since only the displacement due to the field gradient is measured, the measurement range of the device can be optimised for the quantity to be measured, i.e. the magnetic field gradient, and is not dictated by stray signals (vibrations, permanent magnetic field) which pass over the unbalanced mode.

Alternatively, the magnetic-mechanical transduction TMM means could be of the Laplace force type, also called Lorentz force.

Figure 15:
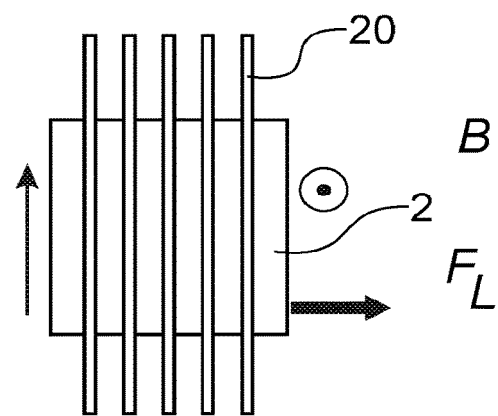
FIG. 15 is a schematic representation of a movable element of a sensor according to the invention including a magnetic sensor formed by electric conductors.

For example, the electric conductors 20, such as electric current lines, are fastened to both movable elements. In FIG. 15, a movable element 2 and electric conductors 20 can be seen schematically represented.

The conductors are disposed in parallel to each other, such that Laplace forces applying to each conductor have the same direction and act in the same sense on the movable element. Preferably, several conductors are implemented to generate a stronger mechanical force on the movable element, but it could be contemplatable to only implement a single conductor. In the example of FIG. 2, the electric conductors are perpendicular to axis X along which the elements 2 and 4 are to be displaced. The structure is sensitive to field gradients $$B_z \left( \frac{\partial B_z}{\partial x} \right).$$

The electric conductors are secured to the movable elements on which they transfer their mechanical loads. For example, a layer of electrically insulating material can be sandwiched between the electric conductors and the body of the movable element in order to ensure electric insulation thereof. Alternatively, the electric conductors may be formed in the body of the movable element by etching. The power supply to the conductors can be made through suspended conducting lines with small stiffnesses which make a bridge between the substrate and the movable elements. Alternatively, the power supply may be made through deformable mechanical elements which also ensure suspension of the movable elements.

The Laplace force $F_L$ corresponds to a mechanical load exerted by the magnetic field on an electric conductor through which a current density j passes.

An elementary force $dF=j\char`\^BdV$ is produced on a conductor element dV of the structure. For a conductor line through which a current I passes, this can be written:

$dF=I\char`\^Bdl$ for a conductor length $dl$.

The Laplace force $F_L$ (FIG. 15) which results from integrating the Laplace force on the entire movable part and exerted by all the conductors can be calculated as:

$F_L=\beta I_L B$ $F_L$, the factor $\beta$ reflecting the integration on all the conductors. As a result of the relationship between the Laplace force and the field B, in order to generate a signal proportional to a field gradient, electric conductors are to be made on both movable elements. The mechanical structure is subjected to mechanical loads which differ from each other among other things regarding the magnetic field gradient.

By calculation, the generalised force which applies to the balanced mechanical mode is written as a combination of loads $F_1$ and $F_2$:

$F_e = \alpha_1 F_1 + \alpha_2 F_2$ $\alpha$, is a parameter which results from the projection of loads on the balanced mode.

with $$F_1 = \beta_1 I_{i1} B(x_0) - \beta_1 I_{L1} \frac{\partial B}{\partial x}(x_0) \frac{\alpha}{2}$$

$$F_2 = \beta_2 I_{i2} B(x_0) + \beta_2 I_{L2} \frac{\partial B}{\partial x}(x_0) \frac{\alpha}{2}$$

where $\beta_1$ and $\beta_2$ are geometric parameters of the structure which are equivalents to a length of the electric conductor, $\beta_1$ and $\beta_2$ can be different from each other. By adjusting currents $I_{L1}$ and $I_{L2}$ so as to remove the mean field component $B_{xo}$ in the force $F_e$, a force in the balanced mode which does not depend on the magnetic field gradient is obtained. $F_e$ only depends on the magnetic field gradient. When:

$\alpha_1 \beta_1 I_{L1} + \alpha_2 \beta_2 I_{L2} = 0$.

This can be obtained when:

| | | | | |
|---|---|---|---|---|
| Case 1 | $\alpha_1 = \alpha_2$ | $\beta_1 = \beta_2$ | $I_{l1} = -I_{l2}$ | $F_e = -\alpha \beta I_L \frac{\partial B}{\delta x}(x_0)\alpha$ |
| Case 2 | $\alpha_1 = -\alpha_2$ | $\beta_1 = \beta_2$ | $I_{l1} = I_{l2}$ | $F_e = -\alpha \beta I_L \frac{\partial B}{\delta x}(x_0)\alpha$ |

When identical currents with a same flow sense are injected into the electric conductors, generalised forces on the balanced and unbalanced mode are generated:

$$F_e = \frac{F_1 - F_2}{2} = \beta I_L \frac{\partial B_z}{\partial x} \alpha$$

$$F_{ne} = \frac{F_1 + F_2}{2} = \beta I_L B_z$$

With a the distance between the geometrical centres of both movable elements; a is multiplied by the magnetic gradient to obtain the field difference between both geometrical centres of the movable elements.

Two operating modes can be distinguished:

According to a first operating mode, the current $I_1$, flowing in the electric conductors of both movable elements is kept constant. Then, this amounts to implementing a permanent magnetic material as has been described above. The differential electromechanical transduction means implemented in the device of FIG. 2 enable the unbalanced mode movement $x_{ne}$ to be diverted from the output signal s from the sensor. It is to be noted that the implementation of the permanent magnetic material as TMM transduction means has the advantage of reducing power consumption of the sensor with respect to electric conductors used to generate Laplace forces.

According to a second operating mode, the current $I_1$, is modulated at a frequency $f_p$: forces exerted on the balanced and unbalanced modes are thus transferred to the frequency domain on this same frequency.

By advantageously choosing the frequency $f_p$ outside the vibration frequency band, a separation of the magnetic field gradient signal from those of the vibrations in the frequency domain is obtained.

Very advantageously, by choosing the frequency $f_p$ close to the resonant frequency of the balanced mode, the sensor sensitivity to the magnetic field gradient signal can be improved by a factor close to the quality factor Q of the same mode. The unbalanced mechanical mode produces in turn a movement proportional to the mean magnetic field: however since the associated excitation signal is outside the frequency band of the unbalanced mode, the movement $x_{ne}$ produced remains moderate.

The implementation of magnetic sensors with electric conductors through which electric currents pass further has the advantage of enabling the permanent or mean magnetic field to be very easily measured, simply by reversing the current sense in the magnetic sensor. The full scale can be adapted with the intensity of electric currents injected into the sensors. The device then enables the magnetic field gradient or mean magnetic field to be measured, by being only slightly sensitive to vibrations.

The TME transduction means implemented in the device of FIG. 2 advantageously enable sensitivity to stray signals present in the unbalanced mode movement to be reduced.

Figure 5:
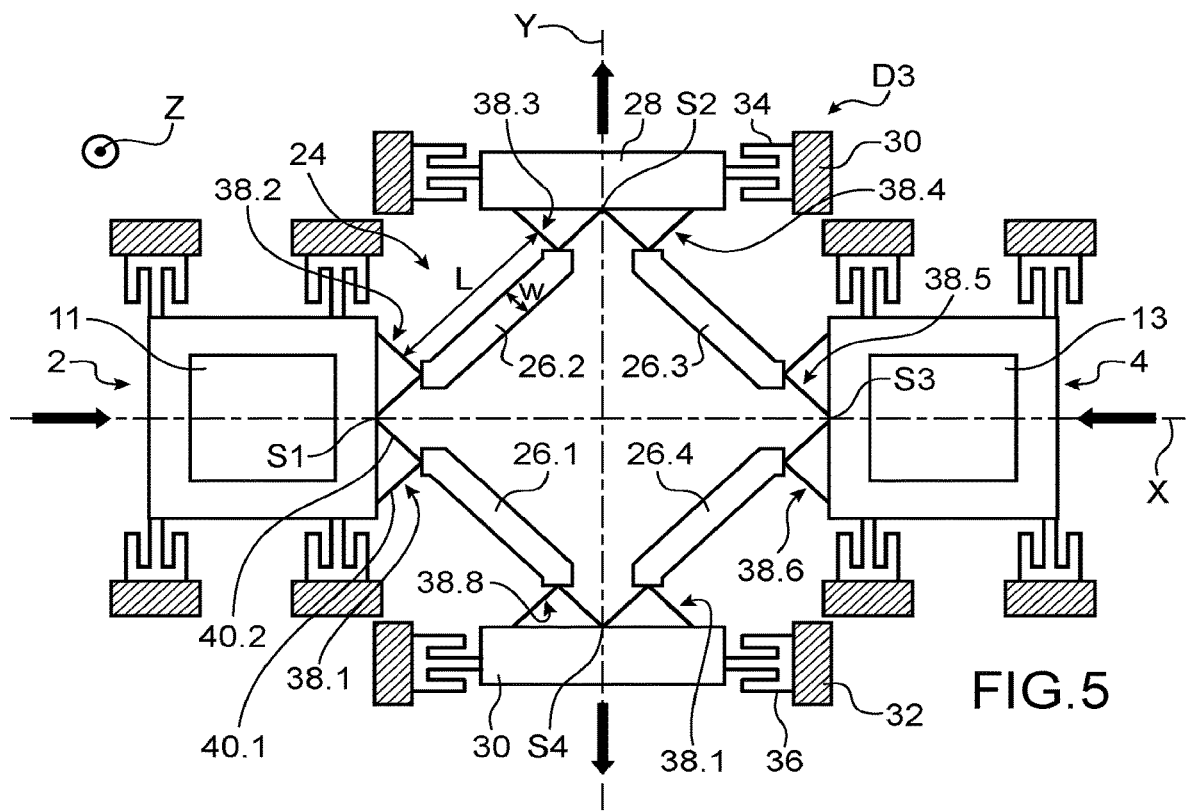
FIG. 5 is a schematically represented top view of another exemplary sensor according to the first embodiment.

In FIG. 5, another example of a device D3 according to the first embodiment can be seen, wherein it is possible to modify mechanical sensitivities of the balanced and unbalanced modes, so as to have a transduction gain $G_e$ much higher than the gain $G_{ne}$.

The device D3 differs from the device D2 in the coupling means.

The coupling means 24 also have a rhombus shape. The beams 26.1 to 26.4 have a strong transverse stiffness. For example, they have a significant width w and a reduced length L. Indeed, the transverse stiffness is proportional to the ratio $(w/L)^3$. The ratio w/L is for example between 1/20 and 1.

Further, the apexes S2 and S4 are connected to translationally movable studs 28, 30 along direction Y. The studs 28, 30 are suspended from anchoring studs 30, 32 by elastic elements 34, 36 respectively.

Additionally, each end of each beam 26.1 to 26.4 is connected to the movable elements and movable studs by pivot hinges 38.1 to 38.8.

In the example represented, all the pivot hinges are similar, only the hinge 38.1 will be described in detail.

The pivot hinge 38.1 connects the beam 26.1 to the movable element 2.

The pivot hinge 38.1 includes two beams 40.1, 40.2. Each beam 40.1, 40.2 has a first longitudinal end attached to a longitudinal end of the beam 26.1 at a same point corresponding to the intersection of the axis of rotation of the pivot hinge 38.1 and the plane of the device. Each beam 40.1, 40.2 includes a second end attached to the movable element at a point distinct from that to which the other beam is attached. The beams 40.1, 40.2 then form a triangle with an edge of the movable element. Advantageously in the example represented, the beams 40.1, 40.2 form an angle of 90° with each other.

According to another exemplary embodiment, the pivot connections each include a single beam having a low in-plane bending stiffness, forming a leaf. This is made possible because the displacement of the connected elements is already limited to a translation by their springs.

In another example, pivot connections include two triangle-shaped leaves, having more rigidity to unwanted displacements, each leaf strongly reducing undesired stiffnesses associated with the other leaf.

This arrangement makes it possible to block translational degrees of freedom along axes X and Y and to offer a sufficiently low torsional stiffness about axis Z to allow relative rotation of parts connected to each other. The coupling structure is then such that two opposite apexes of the rhombus have displacements with a same direction and opposite senses, which are therefore symmetrical with respect to the centre.

As a result, the unbalanced mode movement (displacement of the opposite apexes S1 and S3 of the rhombus in the same direction and same sense) is blocked by the movable studs which can only be displaced along axis Y.

Consequently, the transduction gain $G_{ne}$ of the unbalanced mode is reduced relative to the balanced mode $G_e$.

Preferably, the ratio $G_{ne}/G_e < 0.2$, which makes it possible to yield a significant gain to discard signals produced by vibrations.

The device also includes TMM transduction means and TME transduction means (not represented) which are similar to those of the devices of FIGS. 2 and 4. By implementing the capacitive or strain gauge detection means of the devices D1 and D2 allowing unbalance of gains $T_e$ and $T_{ne}$, this device strongly discards the unbalanced mode.

Figure 6:
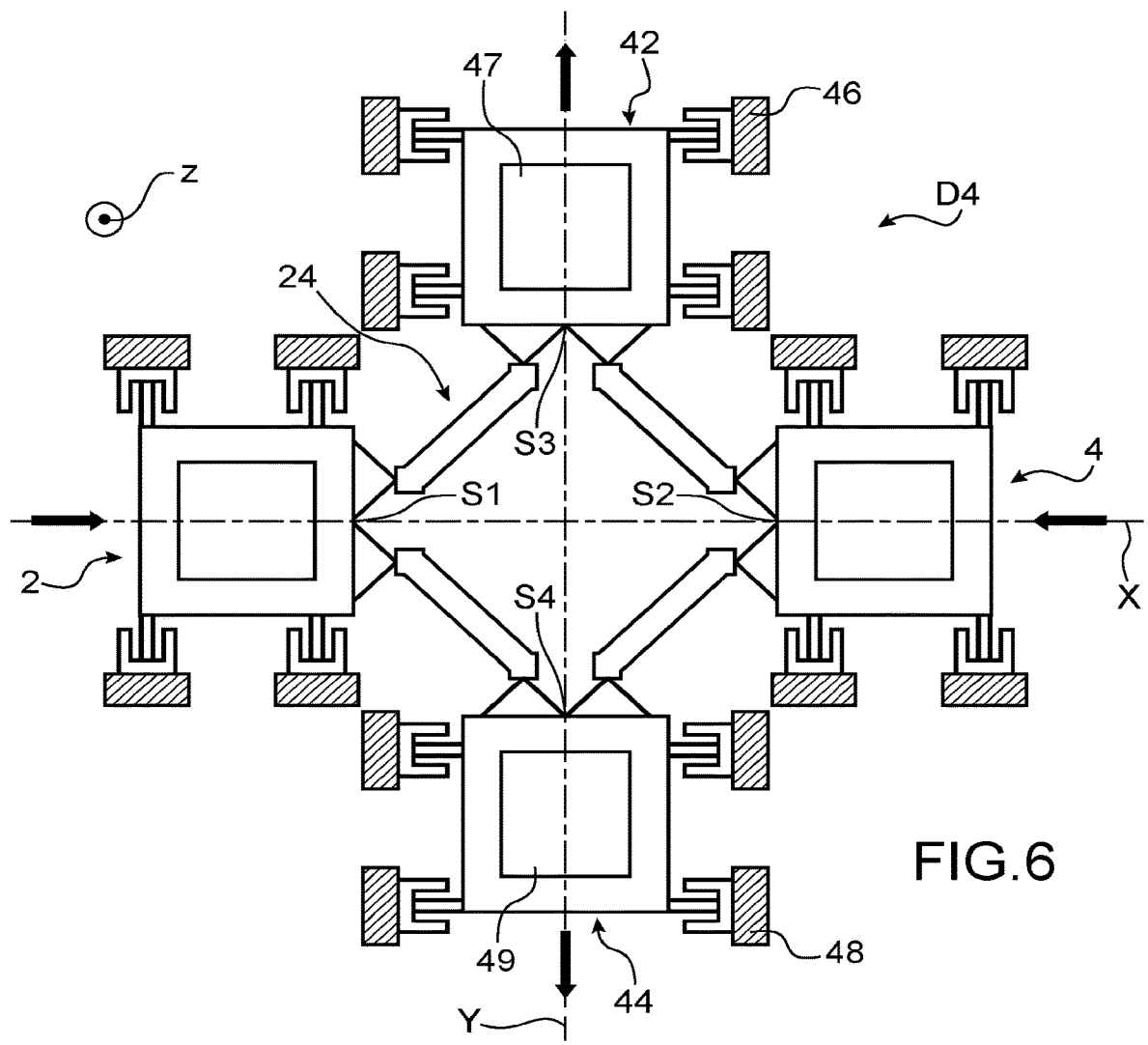
FIG. 6 is a schematically represented top view of another exemplary sensor according to the first embodiment, FIG. 7 a schematically represented top view of another exemplary sensor according to a second embodiment, the sensor structure being rotatably movable in-plane.

In FIG. 6, another example of a device D4 according to the first embodiment can be seen, wherein the apexes S3 and S4 of the rhombus are movably secured to the third 42 and fourth 44 movable elements.

The third and fourth movable elements are suspended from anchoring studs 46, 48 by spring means allowing a translational displacement along direction Y and limiting displacements along direction X and a rotational displacement about axis Z. The third and fourth movable elements can also include magnetic-mechanical transduction TMM means, for example one or more layers of permanent magnetic material 47, 49 or electric conductors supplied with current, to allow generation of Laplace forces acting on the movable elements.

In the balanced mode, the first 2 and the second 4 movable elements are displaced along axis X in opposite senses and the third 42 and fourth 44 movable elements are displaced in opposite senses along axis Y, and when the first and second movable elements move closer to each other, the third and fourth movable elements move away from each other and vice versa The movement of the structure of FIG. 6 is dominated by the balanced mode.

Depending on configurations, for example according to the choice of the magnetic moments of the different magnetic sensors or the current levels passing through the electric conductors, the field gradient component in direction Y or Z along axis X, or the field gradient component in direction X or Z along direction Y can for example be determined.

In another exemplary embodiment, the device includes at least one sensor on one of the four movable elements.

Figure 7:
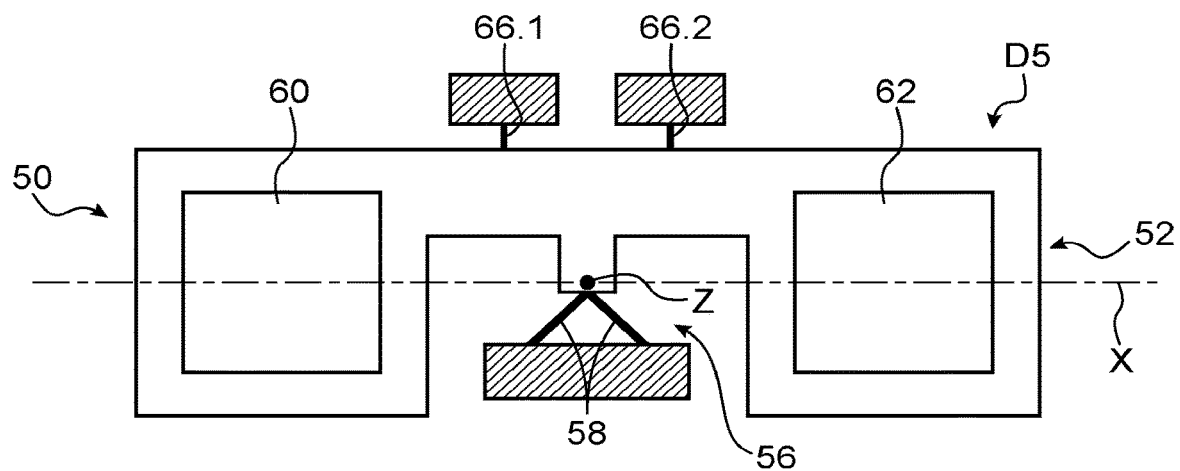

In FIG. 7, an exemplary device according to a second embodiment can be seen, wherein the device includes a pendular structure.

Pendular structures have the advantage of enabling balanced displacement modes to be easily obtained and unbalanced mode sensitivity to be reduced. Indeed, by passing the axis of rotation through the centre of inertia of the device, the centre of inertia is made stationary, which enables balanced mode to be favoured and sensitivity of the mechanical structure to vibrations to be strongly reduced. For example, this is achieved by making the mechanical structure symmetric with respect to a plane passing through the axis of rotation. Other non-symmetric structures as those which will be described in FIG. 13 have a fixed centre of inertia and a balanced mode.

In this second embodiment, at least two magnetic sensors are implemented. Indeed, it is a torque or mechanical moment which is involved in the detection and which is proportional to the magnetic field. A comparison of the torques undergone by both movable elements carrying the magnetic sensors remote from each other enables the field gradient to be determined.

The device D5 includes a first 50 and a second 52 movable elements connected to each other through a rigid beam 54 forming an undeformable structure.

In another exemplary embodiment, the structure has a rectangle shape, the beam 54 having a width substantially equal to those of the movable elements 50 and 52. The attachment of the hinge is for example located in a small recess in the centre of the structure The rigid beam 52 is rotatably hinged in the plane of the substrate by a pivot connection 56 about axis Z. Advantageously, both movable elements and the beam 54 form an undeformable structure.

The pivot connection 56 is similar to the pivot connections of FIG. 5 with two beams 58 tilted relative to each other. The beams 58 ensure rotational movement of the movable elements about axis Z which corresponds to the balanced displacement mode and block the unbalanced displacement mode Transduction TMM means are provided. In the example represented, they are formed by one or more layers of permanent magnetic material 60, 62. The magnetic moments of both layers of permanent materials can be oriented along any axis of the plane. However, the magnetic moments on the first and second movable elements have opposite senses.

The mechanical torque is written as $\Gamma = M \wedge B$ and enables loads able to rotate the first and second movable elements of the mechanical structure to be generated. In the presence of a homogenous external magnetic field, and due to the opposite orientations of the magnetic moments of the materials 60, 62, the mechanical moments generated on each of the movable elements are opposite to each other. The total torque applied to the entire mechanical structure is thus zero: the structure remains stationary and no signal output from the sensor appears. If the field has a gradient along axis X which joins both movable masses, then an unbalance in the mechanical moment appears. The total mechanical torque, considering that the magnetic moments have equal modules is written as:

$$\Gamma_{tot} = M \wedge \left( B\left(x_0 + \frac{a}{2}\right) - B\left(x_0 - \frac{a}{2}\right) \right)$$

$$\Gamma_{tot} = M \wedge \left( \frac{\partial B}{\partial x}(x_0) \right) \alpha$$

With $x_0$ the centre of the centres of the magnetic transducers and a the distance between the centres of the magnetic transducers of both movable elements.

The mechanical loads responsible for the displacement of the movable parts of the mechanical structure are therefore proportional to the magnetic field gradient.

The operation of the device of FIG. 7 is depicted in FIGS. 8A and 8B. The arrows correspond to the magnetic moments.

In FIG. 8A, the device is subjected to a homogenous magnetic field Bext. The first and second movable elements remain aligned with axis X.

In FIG. 8B, the device is subjected to a magnetic field gradient, the first movable element sees a field Bext+B1 and the second movable element sees a magnetic field Bext+B2, B1<B2. The total torque is then such that the structure pivots anticlockwise.

In the case where the TMM means include electric conductors on the movable elements (FIGS. 9A and 9B), they are preferentially oriented toward the axis of rotation. The power supply to the conductors is for example made by beams with low transverse and torsional stiffnesses extending between the movable elements and the substrate.

In the presence of a homogenous magnetic field Bext, the mechanical moment generated by Laplace forces is balanced on either side of the mechanical structure (FIG. 9A). When the structure is subjected to a magnetic field gradient along axis X, the first element sees a field Bext+B1 and the second element sees a field Bext+B2, then an unbalanced in the mechanical moment appears:

$$\Gamma_{tot} = \beta \frac{\alpha}{2} e_x \wedge \left( I_x e_x \wedge B_z e_z \left(x_0 + \frac{a}{2}\right) - I_x e_x \wedge B_z e_z \left(x_0 - \frac{a}{2}\right) \right)$$

$$\Gamma_{tot} = \beta I_x \frac{\partial B}{\partial x}(x_0) \frac{a^2}{2} e_z$$

With $I_x$ the current passing through the conductors 64; $\alpha$ is the distance between the centres of the magnetic transducers on both movable masses; $e_x$ is the unit vector associated with axis X; $e_z$ is a unit vector associated with axis Z; $\beta$ is a factor which results from integrating forces on the magnetic sensors and is homogeneous to a length.

Mechanical loads responsible for the displacement of the movable parts of the mechanical structure are proportional to the magnetic field gradient.

In the example represented, B1<B2, and the structure pivots anticlockwise.

Mechanical-electric transduction TME means are also provided. In the example represented, it includes two strain gauges 66.1, 66.2 suspended between the connection beam 54 and the anchoring studs. The gauges are advantageously symmetrically disposed with respect to the plane passing through axis Z and perpendicular to axis X. The gauges are for example piezoresistive gauges. Each gauge ensures detection of the displacement of a movable element and a differential measurement can be performed. Alternatively, capacitive detection means can be implemented. For example, they include capacitive combs secured to the connection beam, these combs being interdigitated with fixed combs on the substrate so as to perform an air gap or area variation upon displacing the movable part.

In FIGS. 8B and 9B, the gauge 66.1 is loaded in tension and the gauge 66.2 is loaded in compression. A differential torque proportional to the magnetic field gradient is then measured.

A differential measurement enabling the magnetic field gradient to be determined is then performed.

In FIG. 10, an alternative embodiment of the device of FIG. 7 can be seen. The device D6 in which springs 68 connect the movable elements to the substrate, the springs 68 have low transverse and torsion stiffnesses in order not to hinder the rotational displacement of the structure. This alternative is particularly adapted to the implementation of TMM means using electric conductors, the springs 68 are then made at least partly of electrically conducting materials and can be used to supply electric conductors. The springs 68 can either be fully of conducting material, or include a continuous layer ensuring electric conduction.

In FIG. 11, an exemplary embodiment of a device D7 according to the invention which is both close to the device of FIG. 2 and to the device of FIG. 7 can be seen. It includes both translationally movable elements 94, 96 connected by a pivot connection 98 with an axis orthogonal to the plane of the substrate, the pivot hinge 98 includes a central element 100 rotatably hinged to the support and which are connected to each of the movable elements 94, 96 by a flexible beam 102, 104. Each movable element 94, 96 is suspended from the substrate by a spring 106, 108 allowing translational displacement along direction X, but limiting displacements in other directions, in particular rotational displacements about axis Z. This alternative has the advantage of mechanically discarding vibrations and the mean magnetic field effect. Because of the implementation of a pivot connection 98 between both movable elements 94, 96, the balanced mode is allowed by the movable elements which only permit movements with opposite senses whereas the unbalanced mode is discarded because it would involve deformation of the central part 100 in rotation. Capacitive or piezoresistive differential detection means such as those of the device of FIG. 2 can be used. The transduction gain Ge is then increased relative to the gain $G_{ne}$. Further, by implementing differential transduction TME means on each side of the centre of rotation, the gain Te can be increased relative to the gain Tne. Even if the central part deforms, the signal due to this deformation is the same on both gauges and is cancelled upon subtracting the signals.

In FIGS. 12A and 12B, another exemplary device according to the second embodiment can be seen.

The device D8 differs from the device D6 in that its structure is rotatably movable out-of-plane. The axis of rotation Y1 is thus contained in the plane of the device.

The device D8 includes a plate 70 rotatably hinged about axis Y1 by means of a pivot connection 72. In the example represented, the pivot connection 72 includes two beams 74 aligned with axis Y1 and able to be torsionally deformed about axis Y1. The hinged plate carries both movable elements 71, 73.

The transduction TMM means include two magnetic sensors 76.1, 76.2 disposed on a face of the plate 70 on either side of the axis of rotation Y1.

In the example represented, the magnetic sensors 76.1, 76.2 each include one or more oriented layers of permanent magnetic material, such that both magnetic sensors have magnetic moments with an opposite orientation.

The transduction TME means include, in the example represented, strain gauges 75, for example piezoresistive, disposed perpendicular to the axis of rotation and suspended between the substrate and the plate on either side of the axis of rotation Y1. In the example represented, the plate includes two side projections 77 at the axis of rotation, one end of the gauges 75 being attached to one of the projections 77. The disposition of the gauges relative to the axis of rotation is visible in FIG. 12B, they are disposed in a plane different from that of the axis of rotation, such that both gauges are actually deformed upon rotating the structure.

The operation of this device is similar to that of the device D6.

Alternatively, the magnetic sensors can be made by current conductors disposed on either side of the axis of rotation Y1. When it is desired to probe the Bx gradient, the conductors are parallel to axis Y, and when it is desired to probe the By gradient, the lines are parallel to axis X. In both orientations, the forces are oriented along Z. The current conductors generate differential loads proportional to the magnetic field gradient.

Alternatively, the transduction means TME may be of the capacitive type, for example the plate face facing the substrate may include an electrode on each side of the axis of rotation Y1 and form two variable capacitors with an electrode facing the substrate.

In FIG. 13, another exemplary field gradient measurement device D9 according to the second embodiment can be seen.

The system includes a structure comprising two mechanically coupled assemblies E1 and E2. Both assemblies are of similar structures. Only the assembly E1 will be described in detail.

In this example, each assembly E1, E2 has at least one balanced mode and the device has also at least one balanced mode. The unbalanced modes have high stiffnesses or are discarded at high resonant frequencies for which the mechanical vibrations are already non-existent.

In another example, the device has a balanced mode without the assemblies having themselves a balanced mode. Indeed, by adjusting dimensions and dispositions of both assemblies, a structure having a balanced mode can be made. Relative to the structures E1 and E2 of FIG. 13, it can be contemplated to remove one of the movable elements from each assembly. In this case, each of the structures of assemblies E1 and E2 is not balanced, but the structure including both connected assemblies as in FIG. 13 has a balanced mode, for example by adjusting the dimensions of the structure.

The effect of the vibrations on the device D9 is discarded at each assembly E1, E2 due to its low sensitivity to be unbalanced mode. The effect of the mean magnetic field is discarded at the device D9 as will be explained below.

The assembly E1 is rotatably movable about an axis Z1 orthogonal to the plane of the device, it includes two movable elements 78.1, 78.2 connected by a connection beam 80. Strain gauges 82 enable the differential displacement of the structure about axis Z to be measured. The assembly E1 has no plane of symmetry passing through the axis of rotation, but however has a balanced mode. Alternatively, the assembly E1 may be symmetrical with respect to the axis of rotation.

Indeed, considering that the connection beam 80 extends along an axis X1, the first movable element 78.1 extends perpendicular to axis X1 on a side thereof and the second movable element 78.2 extends perpendicular to axis X1, but on the side opposite to the side from which the first movable element 78.1 extends.

In this example, the assembly E2 is disposed close to the assembly E1 such that the connection beam, between both movable elements of the assembly E2, extends along an axis X2 parallel to and distinct from axis X1 and, such that the second movable element 78.2 is aligned with the second movable element of the assembly E2 along axis Y.

It will be understood that the relative dispositions of the assemblies E1 and E2 can vary, for example the axes X1 and X2 may be the same, or the axes X1 and X2 may not be parallel; both second elements may not be aligned.

In the example represented, the intersection of the axes of rotation with the plane of the system are disposed along axis X.

A magnetic sensor 83, 85 is provided for each assembly E1, E2 on the first movable element of the assembly E1 and on the second movable element of E2. They can be formed either by a permanent magnetic material, or by electric conductors.

In the device of FIG. 13, both movable elements of each assembly are used to make a device having at least one balanced mode, but they are not both designed to carry magnetic sensors. The magnetic-mechanical transduction is made at the device as a whole.

The device includes deformable mechanical connection means 84 between the assemblies E1, E2 such that they allow rotational movements of the structures of the assemblies E1, E2 in opposite senses and which block rotations in the same sense.

The mechanical connection means 84 mechanically connect two movable elements of E1 and E2. In the example represented, the connection means 84 are, for example, formed by folded leaves forming a kind of fork including a central portion 84.1 connected to the assembly E1 and two side portions 84.2, 84.3 connected to the assembly E2. Other forms of connection means 84 are contemplatable, for example a beam connecting both movable elements.

Advantageously and as represented in FIG. 12, the maximum stiffness direction of the connection means 84 is perpendicular to the plane defined by both parallel axes of rotation of both pendular structures.

Both assemblies E1, E2 have a balanced mechanical mode and are only slightly sensitive to vibrations.

The mechanical structure thus formed has longitudinal stiffnesses which are high along axis Y and which are low along axis X. The torsion stiffness about axis Z is also low or equivalent in comparison with the torsion stiffnesses of the pivot connections of each device.

Advantageously, the connection means 84 between both assemblies are located in the vicinity of the plane defined by both axes of rotation Z1, Z2. The translational displacements of the structure along the axes perpendicular to the axes of rotation are substantially reduced. Indeed, the displacements along the axes perpendicular to the axes of rotation induce a return load which opposes to the reverse rotational movements of both devices.

In the case of magnetic sensors with a permanent magnetic material, the magnetic moments of both magnetic sensors are parallel to each other and with a same sense in order to generate a mechanical torque rotating both devices in opposite senses, unlike the device D6 in which the magnetic moments of both materials have opposite orientations. This embodiment is advantageous from the manufacture point of view, because making magnetic sensors on a same structure having magnetic moments oriented in the same sense is simpler to obtain than magnetic sensors having magnetic moments with opposite senses.

In the example represented, the materials are disposed on both first movable elements, but they may be disposed on any other part of the assemblies. For example, the magnetic sensor 83 may be formed on the second movable element of the assembly E1. But, preferably, the magnetic sensors are made so as to be as remote from each other as possible, as is made in the device of FIG. 13, so as to increase field gradient effect.

Mechanical moments generated by magnetic sensors produce, using the connection element 84, a rotation of the structures E1 and E2 by angles $\theta_1$ and $$\theta_2 = -\frac{L_1 \theta_1}{L_2}$$

which is proportional to the generalised force:

$$F_1 = \frac{M_{c1}}{L_1} - \frac{M_{c2}}{L_2}$$

with $L_1$ the distance between the connection element and the pivot of each assembly, $M_{c1}$ and $M_{c2}$ the mechanical moments generated by the magnetic sensors. To simplify, the case where $L_1$ and $L_2$ are identical is herein considered.

Mechanical loads applying to both assemblies oppose to each other at the connection means 84. In the presence of a homogenous magnetic field, the magnetic moments generate mechanical moments which are compensated for each other: both assemblies mutually block their movement. No signal output from the sensor is generated. In the general case, magnetic moments and distances to the pivot can be adjusted in order to preferentially satisfy the relationship $$\frac{M_1}{L_1} = \frac{M_2}{L_2}.$$

In the presence of a magnetic field gradient along axis X, a mechanical moment differential appears between both assemblies. The mechanical moment difference, which is proportional to the magnetic field gradient, results in a non-zero load on each assembly. Opposite rotational movements are thus produced on both assemblies, which can be measured by electromechanical transduction means and enable the sensor measurement signal to be provided.

In the case of magnetic sensors formed by electric conductors, the electric conductors of a magnetic sensor are preferentially oriented toward the axis of rotation of the device to which they belong. The structure is then mainly sensitive to the field gradient of the component B.

The choice of the sense for the current passing through the electric conductors depends on the disposition of the electric conductors in the devices, such that the devices are actually rotated in opposite senses in the presence of a field gradient and remain stationary in the presence of a homogeneous field.

In the case where both magnetic sensors are either both made on the outer most movable elements of the system (FIG. 13), or on the innermost movable elements of the system, the senses of the Laplace currents are opposite.

For other cases, the currents could also have the same sense.

As for the sensors with permanent magnetic material, in the presence of a homogenous magnetic field, the mechanical loads compensate for each other, both assemblies are stationary and no measurement signal is generated. In the presence of a magnetic field gradient along axis X, loads proportional to the field gradient are produced and move each of the assemblies the rotational displacement of which is measured by the gauges.

Figure 14:
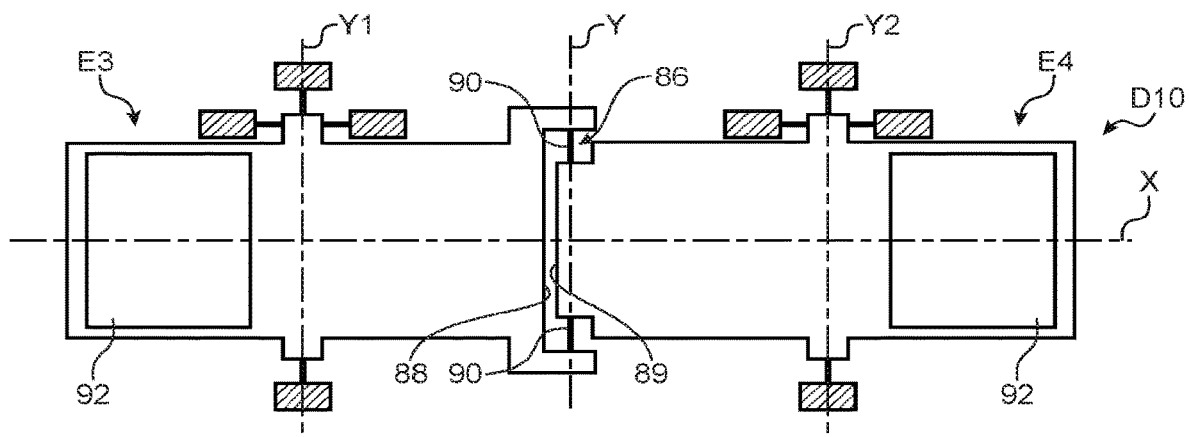
FIG. 14 is a schematically represented top view of another exemplary sensor according to the second embodiment, implementing two assemblies rotatably movable out-of-plane.

In FIG. 14, another exemplary device D10 implementing two assemblies having out-of-plane rotational displacements can be seen.

The device D10 of FIG. 14 combines two assemblies with a structure close to the device of FIG. 12.

Both assemblies E3, E4 are out-of-plane rotatably movable about axes Y1 and Y2 respectively. The assemblies E3 and E4 are aligned side by side along axis X and hinged with respect to each other through a pivot connection 86 with axis Y.

Two longitudinal end edges 88, 89 of both assemblies E3, E4 are facing each other.

In the example represented, the pivot connection 86 includes two beams 90 aligned along axis Y and torsionally deformable about axis Y. Each beam 90 is suspended between both assemblies E3, E4.

When both assemblies E3, E4 pivot, the longitudinal end edges 88, 89 are displaced in the same sense toward the substrate or away from the substrate.

Each assembly includes a magnetic sensor 92.

In the case of magnetic sensors of permanent magnetic material, the magnetic moments of both magnetic sensors are parallel and with a same sense. As for the device of FIG. 13, the magnetic layers can be disposed on any zone of the assemblies E3, E4.

In the presence of a homogenous magnetic field, magnetic moments generate mechanical moments which compensate for each other: both assemblies E3, E4 mutually block their movement. No signal output from the sensor is generated. In the presence of a magnetic field gradient along axis X, a mechanical moment differential appears between both assemblies E3, E4. The difference between the mechanical moments is proportional to the magnetic field gradient, resulting in a non-zero load on each assembly. Opposite rotational movements are thus produced on both assemblies which are detected by the electromechanical transduction means which provide the sensor measurement signal.

In the case of magnetic sensors formed by current conductors, unlike the device of FIG. 13, the electric conductors can be oriented in parallel to the axes of rotation of each device. The direction of the current conductors enables the field gradient component $B_x$ or $B_y$ desired to be measured to be selected. The conductors are oriented along direction X to measure $B_y$, and are oriented in direction Y to measure $B_x$.

In the case where the magnetic sensors are not symmetrically disposed with respect to axis Y, the senses of the Laplace currents can be identical. Under these conditions, they generate mechanical moments with a same sign on the assemblies E3 and E4.

If the magnetic sensors are symmetrically disposed with respect to axis Y as is the case in FIG. 14, Laplace currents flow in opposite senses. In the presence of a homogenous magnetic field, mechanical loads compensate for each other. In the presence of a magnetic field gradient along axis X, loads proportional to the latter are produced and move the mechanical structure. The rotational movement of each of the assemblies can be measured and provide a signal relating to the magnetic field gradient.

One of the advantages of the structures of FIGS. 13 and 14 lies in the orientation of the magnetic moments of the magnetic sensors implemented. In these structures, the magnetic moments are of a same sense: this enables the technological implementation to be substantially simplified.

Indeed, achieving opposite magnetic moments often requires local magnetisation methods such as magnetisation under laser heating, for example localised, and not collective on the substrate scale.

A heterodyne measurement mode can also be applied. This is applicable in the case where magnetic sensors consist of an electric conductor in which a current can be injected. The current is modulated at a frequency $f_p$, which offsets the spectrum of the field gradient signal by the same amount. This enables on the one hand the frequency spectrum of the field gradient to be separated from that of vibrations generally located below 20 kHz for many applications. On the other hand, by positioning the frequency $f_p$ in the vicinity of the resonant frequency of the balanced mode, it is possible to amplify the signal of interest, i.e. the field gradient signal, by a factor up to the quality factor of the balanced mode. The movement according to the unbalanced mode is in turn kept low, because its resonant frequency is preferentially designed to be outside the vibration spectrum. This results in increasingly discarding stray signals.

The gradient measurement device according to the invention can be very advantageously made by microelectronic techniques. Thus, it has advantages of microelectromechanical system (MEMS) in terms of cost, sensitivity, low consumption and miniaturisation and dispenses with disturbing magnetic fields.

Further, by means of the implementation of a structure having at least one balanced actuation mode, the device is only slightly or not sensitive to vibrations, then it can be used to detect a magnetic field gradient in position/speed/current sensors in particular for the automobile field.

Mechanical structures described in FIGS. 2, 4, 5 and 6 have unbalanced displacement modes but having reduced sensitivities to vibrations. Further, unbalanced modes are generally shifted to high frequencies, outside the pass band of the vibrations to which the sensor can be subjected.

The magnetic field gradient sensor can be used for example in detecting an angular position of a camshaft in a combustion engine or to make proximity movement detectors.

The invention claimed is:

1. A magnetic field gradient sensor comprising a support and a structure comprising at least one first and one second movable elements, at least one mechanical coupler for mechanically coupling the first movable element and the second movable element, such that the structure can be displaced according to at least one balanced mechanical mode in the presence of a magnetic field gradient, said sensor also including at least one magnetic mechanical transducer including at least one magnetic sensor mechanically secured to one of the first and second movable elements, so as to be able to apply a mechanical load to the structure in the presence of a magnetic field gradient, and at least one electromechanical transducer including at least one structure displacement sensor for measuring the structural displacement at least for the balanced mode, wherein the at least one magnetic mechanical transducer is configured to have a higher magnetic-mechanical transduction gain for movements in the balanced mode than for movements in the unbalanced mode, and/or the at least one electromechanical transducer is configured to have a higher electromechanical gain for movements in the balanced mode than for movements in the unbalanced mode.

2. The magnetic field gradient sensor according to claim 1, including at least two magnetic sensors, each of the magnetic sensors being mechanically secured to one of the first and second movable elements, so as to be able to apply a mechanical load to the structure in the presence of a magnetic field gradient, at least one mechanical coupler for mechanically coupling the first movable element and the second movable element, such that the structure can be displaced according to at least one balanced mechanical mode in the presence of a magnetic field gradient, and at least one structure displacement sensor at least for the balanced mode.

3. The magnetic field gradient sensor according to claim 1, wherein the at least one mechanical coupler allows translational displacement of the first movable element and second movable element with respect to each other along a first given direction at least in an opposite sense, corresponding to the balanced mechanical mode, said first movable element and said second movable element being translationally displaced in the same plane.

4. The magnetic field gradient sensor according to claim 3, wherein the at least one mechanical coupler is also secured to two other movable elements translationally movable along a direction orthogonal to the first direction and prohibits displacement in phase of the first and second movable elements, corresponding to an unbalanced mechanical mode.

5. The magnetic field gradient sensor according to claim 3, wherein the at least one mechanical coupler includes a spring, for example a rhombus-shaped spring, the first and second movable elements being each connected to an apex of the rhombus, the apexes being opposite to each other.

6. The magnetic field gradient sensor according to claim 2, wherein the at least one mechanical coupler forms a pivot connection of the structure to the support.

7. The magnetic field gradient sensor according to claim 6, wherein the at least one mechanical coupler rigidly connects the first movable element and the second movable element.

8. The magnetic field gradient sensor according to claim 1, wherein the at least one structure displacement sensor in the balanced mode is a capacitive sensor.

9. The magnetic field gradient sensor according to claim 8, wherein the at least one structure displacement sensor in balanced mode include at least two capacitive combs, one comb being secured to a movable element and one comb being secured to the support, and wherein even combs are electrically connected in parallel.

10. The magnetic field gradient sensor according to claim 1, wherein the at least one structure displacement sensor in balanced mode includes at least one strain gauge suspended between the support and the at least one coupler.

11. The magnetic field gradient sensor according to claim 1, including two assemblies, each assembly including the first or the second movable element, the at least one mechanical coupler connecting both assemblies.

12. The magnetic field gradient sensor according to claim 11, wherein each assembly has a balanced mode.

13. The magnetic field gradient sensor according to claim 11, including at least two magnetic sensors, each of the magnetic sensors being mechanically secured to one of the first and second movable elements, so as to be able to apply a mechanical load to the structure in the presence of a magnetic field gradient, at least one mechanical coupler for mechanically coupling the first movable element and the second movable element, such that the structure can be displaced according to at least one balanced mechanical mode in the presence of a magnetic field gradient, and at least one structure displacement sensor at least for the balanced mode, and wherein each assembly is rotatably hinged to the support about an axis of rotation, both axes of rotation of both assemblies being parallel to each other, the at least one coupler being such that they allow rotational movements of both assemblies in opposite senses and prohibit rotational movements of both assemblies in the same sense.

14. The magnetic field gradient sensor according to claim 1, wherein each magnetic sensor includes at least one permanent magnetic material deposited on at least one movable element.

15. The magnetic field gradient sensor according to claim 14, including at least two magnetic sensors, each of the magnetic sensors being mechanically secured to one of the first and second movable elements, so as to be able to apply a mechanical load to the structure in the presence of a magnetic field gradient, at least one mechanical coupler for mechanically coupling the first movable element and the second movable element, such that the structure can be displaced according to at least one balanced mechanical mode in the presence of a magnetic field gradient, and at least one structure displacement sensor at least for the balanced mode, and wherein both magnetic sensors have magnetic moments with an opposite orientation.

16. The magnetic field gradient sensor according to claim 13, wherein each magnetic sensor includes at least one permanent magnetic material deposited on at least one movable element, and both magnetic sensors have magnetic moments with a same orientation.

17. The magnetic field gradient sensor according to claim 1, wherein each magnetic sensor includes at least one electric conductor for an electric current to pass therethrough.

18. The magnetic field gradient sensor according to claim 17,
wherein the electric current is modulated at the resonant frequency of the balanced mode.

19. The magnetic field gradient sensor according to claim 18, including flexible electrically conducting elements connecting the movable elements to contact studs secured to the support.

20. The magnetic field gradient sensor according to claim 17, wherein the at least one electric conductor extends in a direction such that Laplace forces generated move the structure of the device.

21. The magnetic field gradient sensor according to claim 17, wherein the at least one mechanical coupler rigidly connects the first movable element and the second movable element, wherein the at least one structure displacement sensor in the balanced mode is a capacitive sensor, said magnetic field gradient including two assemblies, each assembly including the first or the second movable element, the at least one mechanical coupler connecting both assemblies, wherein each assembly has a balanced mode, said magnetic field gradient sensor also including at least two magnetic sensors, each of the magnetic sensors being mechanically secured to one of the first and second movable elements, so as to be able to apply a mechanical load to the structure in the presence of a magnetic field gradient, at least one mechanical coupler for mechanically coupling the first movable element and the second movable element, such that the structure can be displaced according to at least one balanced mechanical mode in the presence of a magnetic field gradient, and at least one structure displacement sensor at least for the balanced mode, and wherein each assembly is rotatably hinged to the support about an axis of rotation, both axes of rotation of both assemblies being parallel to each other, the at least one coupler allowing rotational movements of both assemblies in opposite senses and prohibiting rotational movements of both assemblies in the same sense, and wherein the at least one electric conductor is oriented toward the axis of rotation of the pivot connection formed by the mechanical coupling means.

22. The magnetic field gradient sensor according to claim 4, wherein the at least one mechanical coupler includes a spring, for example a rhombus-shaped spring, the first and second movable elements being each connected to an apex of the rhombus, the apexes being opposite to each other.

* * * * *